United States Patent
Sato

(10) Patent No.: US 10,008,605 B2
(45) Date of Patent: Jun. 26, 2018

(54) CONNECTING STRUCTURE AND METHOD FOR MANUFACTURING THE SAME, AND SEMICONDUCTOR DEVICE

(71) Applicant: FUJITSU LIMITED, Kawasaki-shi, Kanagawa (JP)

(72) Inventor: Shintaro Sato, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 14/872,687

(22) Filed: Oct. 1, 2015

(65) Prior Publication Data
US 2016/0027928 A1 Jan. 28, 2016

Related U.S. Application Data

(63) Continuation of application No. PCT/JP2013/078046, filed on Oct. 16, 2013.

(30) Foreign Application Priority Data

Apr. 3, 2013 (JP) .................. 2013-078010

(51) Int. Cl.
*H01L 29/16* (2006.01)
*H01L 29/786* (2006.01)
(Continued)

(52) U.S. Cl.
CPC ........ *H01L 29/78618* (2013.01); *B82Y 40/00* (2013.01); *C01B 32/16* (2017.08);
(Continued)

(58) Field of Classification Search
CPC ........... H01L 29/78618; H01L 29/1606; H01L 51/0048; H01L 29/66045; H01L 21/043; H01L 51/105
See application file for complete search history.

(56) References Cited

U.S. PATENT DOCUMENTS

2005/0212014 A1  9/2005  Horibe et al.
2011/0102068 A1* 5/2011  Bouchiat ............ G01N 27/4146
                                                            327/527
(Continued)

FOREIGN PATENT DOCUMENTS

JP   2005-285822 A   10/2005
JP   2009-065057 A   3/2009
(Continued)

OTHER PUBLICATIONS

Chujo et al., "A Novel Silane Coupling Agent. 1. Synthesis of Trimethoxysilyl-Terminated Poly(N-acetylethylenimine)", Macromolecules, 22 (1989): pp. 2040-2043.*

(Continued)

*Primary Examiner* — Michele Fan
(74) *Attorney, Agent, or Firm* — Kratz, Quintos & Hanson, LLP

(57) ABSTRACT

A connecting structure includes: a Si substrate; a nanocarbon material formed above the Si substrate; and an electrode electrically connected to the nanocarbon material, wherein a molecular material having a doping function is inserted between the Si substrate and the nanocarbon material. With this configuration, a highly-reliable connecting structure and a method for manufacturing the same are obtained which realize, even though using the nanocarbon material, a sufficiently low contact resistance between the nanocarbon material and the electrode.

15 Claims, 10 Drawing Sheets

(51) Int. Cl.
*H01L 21/04* (2006.01)
*H01L 29/66* (2006.01)
*B82Y 40/00* (2011.01)
*H01L 29/778* (2006.01)
*C01B 32/16* (2017.01)
*C01B 32/184* (2017.01)
*H01L 51/00* (2006.01)
*H01L 29/06* (2006.01)
*H01L 29/51* (2006.01)

(52) U.S. Cl.
CPC .......... *C01B 32/184* (2017.08); *H01L 21/043* (2013.01); *H01L 29/1606* (2013.01); *H01L 29/66045* (2013.01); *H01L 29/778* (2013.01); *H01L 29/78603* (2013.01); *H01L 29/78684* (2013.01); *H01L 29/0673* (2013.01); *H01L 29/517* (2013.01); *H01L 51/0045* (2013.01)

(56) References Cited

U.S. PATENT DOCUMENTS

| | | | |
|---|---|---|---|
| 2011/0170330 A1* | 7/2011 | Oezyilmaz | B82Y 10/00 365/145 |
| 2012/0037907 A1 | 2/2012 | Whiting et al. | |
| 2012/0058350 A1* | 3/2012 | Long | B82Y 10/00 428/446 |
| 2012/0064708 A1* | 3/2012 | Miyoshi | H01L 21/02211 438/591 |
| 2012/0292758 A1 | 11/2012 | Ono | |
| 2013/0240027 A1* | 9/2013 | Zakhidov | H01L 51/444 136/255 |

FOREIGN PATENT DOCUMENTS

| | | | |
|---|---|---|---|
| JP | 2009065057 A | * | 3/2009 |
| JP | 2012-516560 A | | 7/2012 |
| JP | 2012-243936 A | | 12/2012 |
| JP | 2013-004718 A | | 1/2013 |

OTHER PUBLICATIONS

Office Action of Taiwanese Patent Application 102138065 dated Nov. 11, 2015, with translation of the relevant part of the Office Action.

PCT/JP2014/078046: International Search Report and Written Opinion (partial English-language translation) dated Dec. 17, 2013.

Kang et al., High-performance electronics using dense, perfectly aligned arrays of single-walled carbon nanotubes, Nature Nanotechnology, 2, 230-236, Mar. 25, 2007.

Sugimura et al., Organosilane self-assembled monolayers formed at the vapour/solid interface, Surface and Interface Analysis, 2002; 34:550-554.

Office Action of Japanese Patent Application 2014-066715 dated Nov. 7, 2017 (4 Sheets, 3 Sheets translation, 7 Sheets total).

* cited by examiner

CONNECTING STRUCTURE AND METHOD FOR MANUFACTURING THE SAME, AND SEMICONDUCTOR DEVICE

CROSS-REFERENCE TO RELATED APPLICATIONS

This application is a continuation application of International Application PCT/JP2013/078046 filed on Oct. 16, 2013 and designated the U.S., which claims the benefit of priority of the prior Japanese Patent Application No. 2013-078010, filed on Apr. 3, 2013, the entire contents of which are incorporated herein by reference.

FIELD

The embodiments discussed herein are directed to a connecting structure and a method for manufacturing the same, and a semiconductor device.

BACKGROUND

Current LSIs have been improved in characteristics by miniaturization. However, the miniaturization proceeds into a situation that a gate length of a transistor becomes below 30 nm, thereby bringing about adverse effects of the miniaturization. Hence, an attempt is being made by utilizing, in place of silicon which is conventionally used, another material higher in mobility for a channel to improve the characteristics. For materials therefor, semiconductors such as germanium, InGaAs and so on are floated as candidates, and so-called nanocarbon materials having extremely high mobility, such as graphene, carbon nanotube and so on are also drawing attention.

[Non-Patent Document 1] H. Sugimura et al., Surf. Interf. Anal. 34 (2002) 550.
[Non-Patent Document 2] Kang et al., Nature Nanotechnology 2, 230-236 (2007)

SUMMARY

Graphene has a high mobility of about 100,000 $cm^2/Vs$ even at room temperature, and has no difference in mobility between electron and hole, and therefore is expected as a channel material in the future. However, graphene is a new channel material, and therefore an electrode material suitable as a source electrode and a drain electrode has not been grasped and is continuously searched for at present.

As a source electrode and a drain electrode of a transistor (graphene transistor) using graphene as the channel material, electrodes using Ti such as Ti/Au, Ti/Pd or the like as an adhesive layer, or electrodes of Ni or the like are usually used. However, their contact resistance is high, and is about 500 Ωμm in the best case. Unless the contact resistance is reduced by, for example, a single digit or more, practical application of the graphene transistor seems difficult.

A connecting structure of the present invention includes: a substrate; a nanocarbon material formed above the substrate; and an electrode electrically connected to the nanocarbon material, wherein a molecular material having a doping function is inserted between the substrate and the nanocarbon material.

A method for manufacturing a connecting structure of the present invention includes: forming a molecular material having a doping function on a substrate; forming a nanocarbon material on the molecular material; and forming an electrode electrically connected to the nanocarbon material.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

In this embodiment, a schematic configuration of a connecting structure that is a basic configuration of the present invention will be described. This connecting structure is applicable to various transistors, Hall element, and so on using a nanocarbon material.

Figure 1:
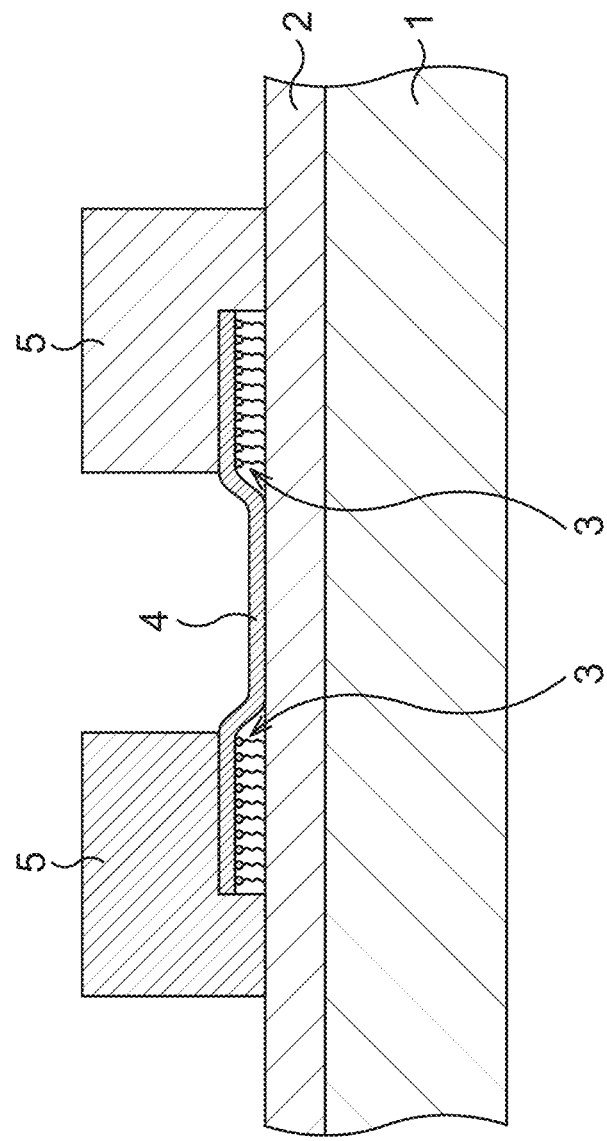
FIG. 1 is schematic cross-sectional view illustrating a configuration of a connecting structure according to a first embodiment.

FIG. 1 is a schematic cross-sectional view illustrating a configuration of a connecting structure according to a first embodiment.

The connecting structure according to this embodiment is configured such that an insulating film 2 is formed on a Si substrate 1 as a substrate, and a molecular material 3 composed of dopant molecules having a doping function, a nanocarbon material 4, and an electrode 5 electrically connected to the nanocarbon material 4 are provided on the insulating film 2.

For the substrate, an insulating substrate or the like may be used in place of the Si substrate 1. The insulating film 2 is, for example, a silicon oxide film or the like.

The molecular material 3 is composed of dopant molecules providing charges (electrons or holes) to the nanocarbon material 4, for example, molecules of one kind of $F_4$-TCNQ (2,3,5,6-tetrafluoro-7,7,8,8-tetracyanoquinodimethane), $F_2$-TCNQ, F-TCNQ, TCNQ, pentacene fluoride, PEI (Polyethylenimine), diazonium salt (4-(N,N-Dimethylamino)benzenediazonium Tetrafluoroborate, 4-Bromobenzenediazonium Tetrafluoroborate and so on), benzylviologen, alkylsilane fluoride (heptadecafluoro-1,1,2,2-tetrahydro-decyl-1-trimethoxysilane and so on), 3-aminopropyltrimethoxy(ethoxy)silane, N-methyl-3-aminopropylmethoxysilane, and N-dimethyl-3-aminopropylmethoxysilane.

Here, $F_4$-TCNQ, $F_2$-TCNQ, F-TCNQ, TCNQ, pentacene fluoride, diazonium salt, benzylviologen, alkylsilane fluoride are molecules which function as a p-type dopant.

PEI, 3-aminopropyltrimethoxy(ethoxy)silane, N-methyl-3-aminopropylmethoxysilane, and N-dimethyl-3-aminopropylmethoxysilane are molecules which function as an n-type dopant.

The molecular material 3 may be a so-called SAM film that is a monomolecular layer. As the SAM layer, an organic silane series (3-aminopropyltrimethoxy(ethoxy)silane or the like) is mainly used when a formation part surface is an oxide series such as silicon oxide film, and an organic sulfur series (alkylthiol or the like) may be used, for example, when the SAM layer is formed on a metal surface.

In this embodiment, the molecular material 3 is formed of, for example, the organic silane-based SAM film composed of 3-aminopropyltrimethoxysilane as the dopant molecules. The molecular material 3 is inserted between the insulating film 2 and the nanocarbon material 4 so as to be aligned with a region connected to the electrode 5 of the nanocarbon material 4, on the insulating film 2.

The nanocarbon material 4 is graphene or a carbon nanotube and is disposed above the insulating film 2 via the molecular material 3.

The electrode 5 is composed of a conductive material that rarely modulates an electronic state of the nanocarbon material 4, for example, a metal material of one kind of Au, Ag, Al, Pt, Cu, Ir, and Pd. In the example of FIG. 1, the electrode 5 is a pair of electrodes.

In the connecting structure according to this embodiment, the molecular material 3 composed of the dopant molecules is inserted between the insulating film 2 and the nanocarbon material 4. The molecular material 3 is disposed to be aligned with the region connected to the electrode 5 of the nanocarbon material 4. With this configuration, the nanocarbon material 4 is supplied with charges from the dopant molecules of the molecular material 3 and increases in density of states. This greatly decreases a contact resistance between the nanocarbon material 4 and the electrode 5.

As described above, according to this embodiment, a highly-reliable connecting structure that realizes, even though using the nanocarbon material 3, a sufficiently low contact resistance between the nanocarbon material 3 and the electrode 5.

Second Embodiment

This embodiment discloses a transistor (graphene transistor) using graphene for the channel material, to which the connecting structure according to the first embodiment is applied. In this embodiment, the configuration of the graphene transistor will be described together with a method for manufacturing the same.

FIG. 2A to FIG. 3C are schematic cross-sectional views illustrating a method for manufacturing a graphene transistor according to a second embodiment in a process order. FIG. 4A, FIG. 4B are schematic plan views illustrating predetermined processes in the method for manufacturing the graphene transistor according to the second embodiment. FIG. 3A corresponds to a cross section taken along a broken line I-I' in FIG. 4A, FIG. 4B.

Figure 2A:
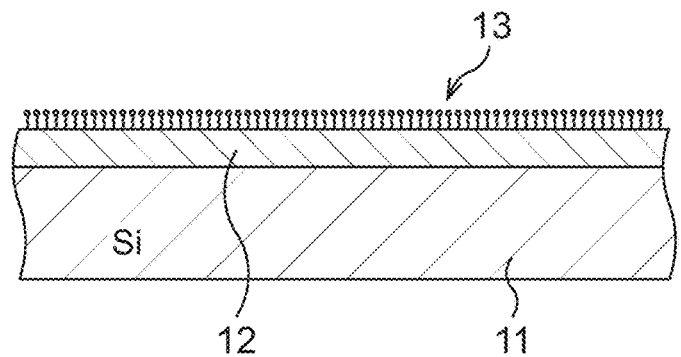
FIG. 2A is a schematic cross-sectional view illustrating a method for manufacturing a graphene transistor according to a second embodiment in a process order.

First, as illustrated in FIG. 2A, a molecular material 13 is formed.

In more detail, a substrate, here, a Si substrate 11 is prepared, and a silicon oxide film 12 is formed on the Si substrate 11 by thermal oxidation or the like.

Next, on the silicon oxide film 12, the molecular material 13 is formed as a SAM film by the gas phase method (refer to Non-Patent Document 1).

In more detail, the Si substrate 11 on which the silicon oxide film 12 is formed and dopant molecules put in an open container, here, 3-aminopropyltrimethoxysilane are sealed in an airtight container made of Teflon (registered trademark) in a glove box under an atmospheric pressure. Then, the airtight container made of Teflon (registered trademark) is placed in an electric furnace and subjected to heat treatment for about several hours. The heating temperature is set to, for example, 100° C. By the heat treatment, a SAM film of 3-aminopropyltrimethoxysilane is formed on the silicon oxide film 12.

Then, the formed SAM film is subjected to various treatments. Specifically, an ethanol treatment, a toluene treatment, a treatment with 1 mM potassium hydroxide, and a treatment with 1 mM nitric acid are performed for about 10 minutes each in sequence. Thereafter, the SAM film is cleaned with pure water, and then subjected to a blow treatment with $N_2$.

Thus, the molecular material 13 composed of the SAM film is formed.

Figure 2B:
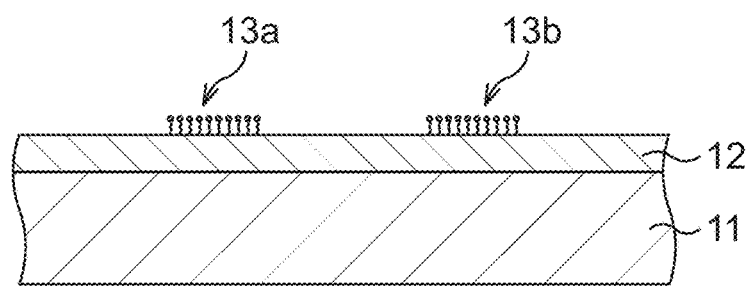
FIG. 2B is a schematic cross-sectional view illustrating, subsequently to FIG. 2A, the method for manufacturing the graphene transistor according to the second embodiment in the process order.

Subsequently, as illustrated in FIG. 2B, the molecular material 13 is patterned.

In more detail, a resist is applied onto the molecular material 13, and the resist is processed by the photolithography so that the resist is left on electrode forming regions on the molecular material 13. Using the resist as a mask, the molecular material 13 is subjected to wet etching with a strong acid (nitric acid or the like), whereby exposed portions of the molecular material 13 are patterned. In place of the wet etching, dry etching utilizing oxygen plasma or the like may be performed. Thereafter, the resist is removed by wet etching using a predetermined chemical or the like. Thus, the molecular material 13 remains only on the electrode forming regions on the silicon oxide film 12. The remaining molecular material 13 is molecular materials 13a, 13b.

Figure 2C:
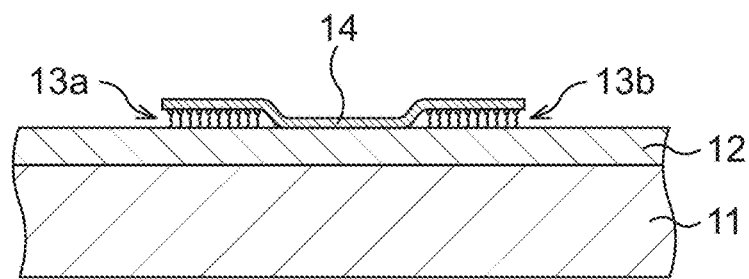
FIG. 2C is a schematic cross-sectional view illustrating, subsequently to FIG. 2B, the method for manufacturing the graphene transistor according to the second embodiment in the process order.

Subsequently, as illustrated in FIG. 2C, a graphene film 14 is formed by transfer on the molecular materials 13a, 13b.

First, graphene is formed.

In more detail, for example, a base on which a copper thin film is formed into a thickness of about 1000 nm, for example, on a silicon substrate with an oxide film is placed in a CVD device, and a source gas is introduced into the CVD device. As the source gas, for example, a mixed gas of methane ($CH_4$), $H_2$, and Ar is used. The flow rate of the $CH_4$ gas is set to about 0.75 sccm, the flow rate of the $H_2$ gas is set to about 100 sccm, and the flow rate of the Ar gas is set to about 1000 sccm.

Under the above growth conditions, graphene is deposited, for example, for 60 minutes. The graphene has a sufficiently large grain size, and is formed as a single crystal and a single layer (monoatomic layer). Here, by arbitrarily controlling the growth conditions (for example, setting the growth time to long or the like), graphene can be formed into two layers or three layers, or a larger number of layers.

Next, the graphene formed on the base is transferred onto the molecular materials 13a, 13b. The transferred graphene is appropriately patterned by the lithography and etching. The etching is performed using oxygen plasma. Thus, the graphene film 14 constituting a channel region is formed on the molecular materials 13a, 13b.

Figure 3A:
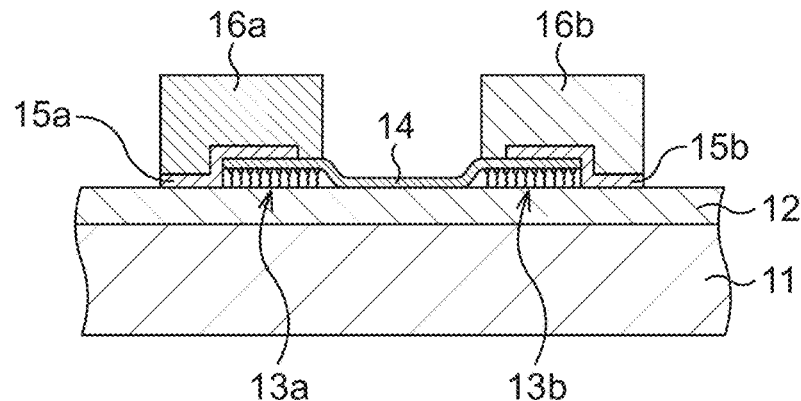
FIG. 3A is a schematic cross-sectional view illustrating, subsequently to FIG. 2C, the method for manufacturing the graphene transistor according to the second embodiment in the process order.
Figure 4A:
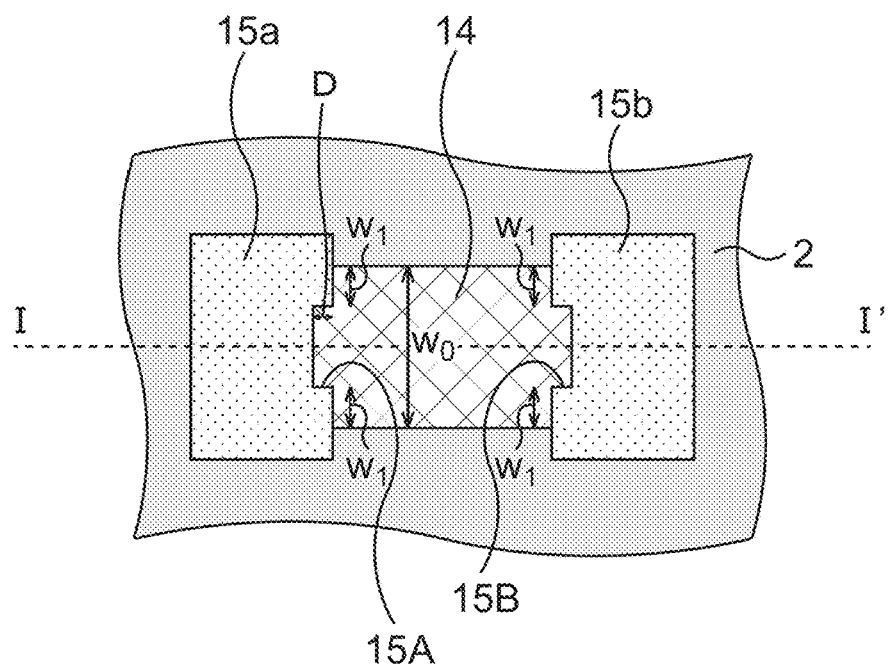
FIG. 4A is a schematic plan view illustrating a predetermined process in the method for manufacturing the graphene transistor according to the second embodiment.
Figure 4B:
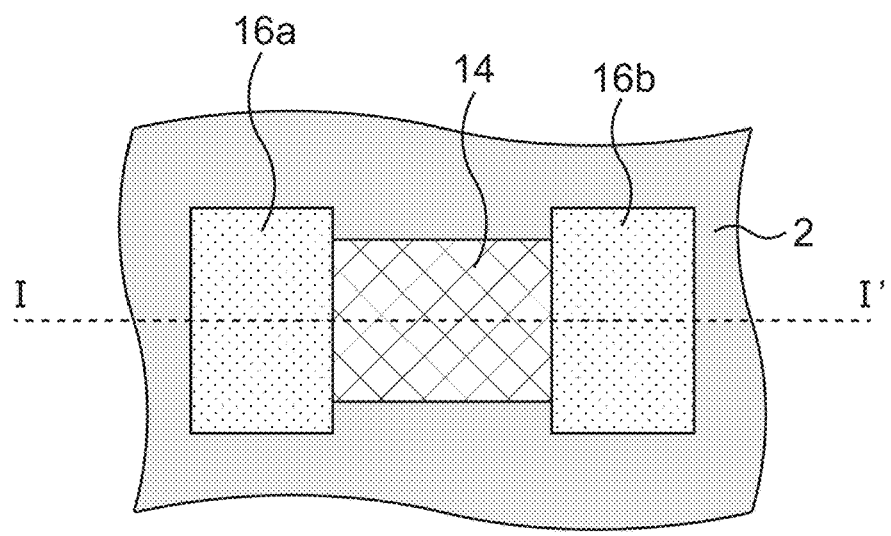
FIG. 4B is a schematic plan view illustrating a predetermined process in the method for manufacturing the graphene transistor according to the second embodiment.

Subsequently, as illustrated in FIG. 3A, a source electrode 16a and a drain electrode 16b are formed on the graphene film 14 via adhesive films 15a, 15b.

First, as illustrated in FIG. 3A and FIG. 4A, the conductive adhesive films 15a, 15b are formed on the graphene film 14 and an electrode material is formed thereon.

In more detail, a resist is applied to the entire surface including the top of the graphene film 14, and the resist is processed by the photolithography to form predetermined openings. An adhesive material and an electrode material are sequentially deposited on the entire surface including the inside of the openings. As the adhesive material, a metal material of one kind of Ti, Cr, and Ni, here, Ti is deposited into a thickness of about 1 nm. As the electrode material, a metal material of one kind of Au, Ag, Al, Pt, Cu, Ir, and Pd, here, Au is deposited into a thickness of about 5 nm. By the lift-off method, the resist and Ti and Au thereon are removed. Thus, the conductive adhesive films 15a, 15b are formed on the graphene film 14, and Au is formed thereon. Note that in FIG. 4A, the illustration of Au on the adhesive films 15a, 15b is omitted in consideration of viewability of the drawing.

The adhesive films 15a, 15b (and Au thereon) are formed into electrode shapes covering the electrode forming regions on the graphene film 14 including the regions corresponding to the top of the molecular materials 13a, 13b, and formed to be smaller in area than electrodes which will be formed afterward. Specifically, in the adhesive films 15a, 15b, recessed parts 15A, 15B are formed to leave channel edge parts at portions facing to each other on the graphene film 14. Where the overall width of the graphene film 14 is $W_0$ and the width of the portion of the graphene film 14 corresponding to the channel edge part is $W_1$, the recessed parts 15A, 15B are formed so that a ratio R of the width $W_1$ in the width $W_0$ satisfies $$R = 2W_1/W_0 \times 100 \le 10\%.$$

A recess depth D of the recessed parts 15A, 15B is adjusted to be about 10 nm or more and about 5 μm or less. The adhesive material such as Ti, Cr, Ni or the like may modulate the electronic state of the graphene to deteriorate the contact resistance. In this embodiment, the adhesive material is removed near the channel edge parts into which charges are injected from the electrodes to form the recessed parts 15A, 15B. Thus, regions where the electrodes are in direct contact with the graphene film 14 at the recessed parts 15A, 15B are provided when the electrodes are formed, thereby suppressing as much as possible the modulation of the electronic state in the graphene film 14. When the above ratio R is 10% or less, the modulation of the electronic state is reduced to a degree of causing little or no problem.

Next, as illustrated in FIG. 3A and FIG. 4B, a source electrode 16a and a drain electrode 16b are formed on the adhesive films 15a, 15b and on Au thereon.

In more detail, a resist is applied to the entire surface including the top of the adhesive films 15a, 15b and Au thereon, and the resist is processed by the photolithography to form openings that expose the electrode forming regions. The electrode material, here, Au is deposited by the vacuum deposition method or the like on the entire surface including the inside of the openings into a thickness of, for example, about 50 nm. By the lift-off method, the resist and Au thereon are removed. Thus, the source electrode 16a and the drain electrode 16b covering the adhesive films 15a, 15b are formed. Below regions of the source electrode 16a and the drain electrode 16b, which are electrically connected to the graphene film 14, the molecular materials 13a, 13b are located. The source electrode 16a and the drain electrode 16b are in direct contact with the graphene film 14 at the recessed parts 15A, 15B of the adhesive films 15a, 15b. This configuration suppresses as much as possible the modulation of the electronic state in the graphene film 14.

Figure 3B:
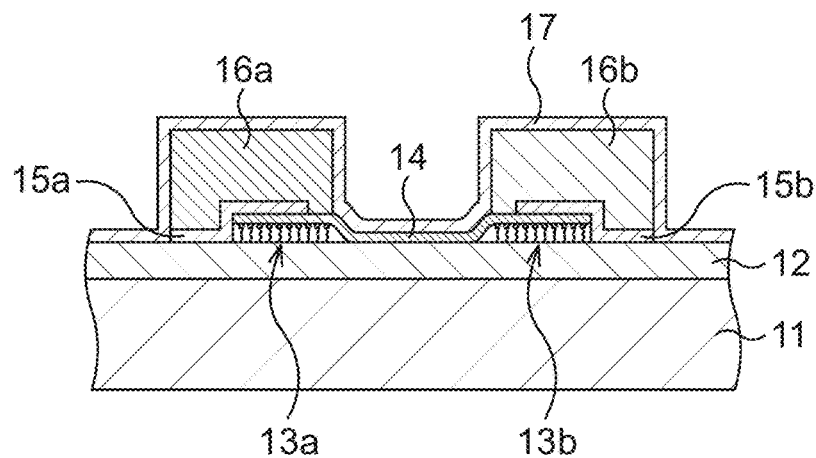
FIG. 3B is a schematic cross-sectional view illustrating, subsequently to FIG. 3A, the method for manufacturing the graphene transistor according to the second embodiment in the process order.

Subsequently, as illustrated in FIG. 3B, a gate insulating film 17 is formed.

In more detail, first, on the entire surface including the graphene film 14 between the source electrode 16a and the drain electrode 16b, Al is deposited by the vacuum deposition method or the like into a thickness of, for example, about 1 nm, and the Al is subjected to natural oxidation.

Then, for example, $HfO_2$ is deposited as an insulating material on Al. $HfO_2$ is deposited, for example, by the Atomic Layer Deposition method (ALD method) into a thickness of, for example, about 5 nm. Thus, the gate insulating film 17 is formed.

Note that the deposition of $HfO_2$ may be performed, for example, by the CVD method, the sputtering method or the like in place of the ALD method. Further, instead of depositing $HfO_2$, a nitride or an oxynitride of Hf may be used. Besides, an oxide, a nitride, or an oxynitride of Si, Al, Zr, Ti, Ta, W may be used or they may be appropriately selected and deposited into multiple layers to form the gate insulating film.

Figure 3C:
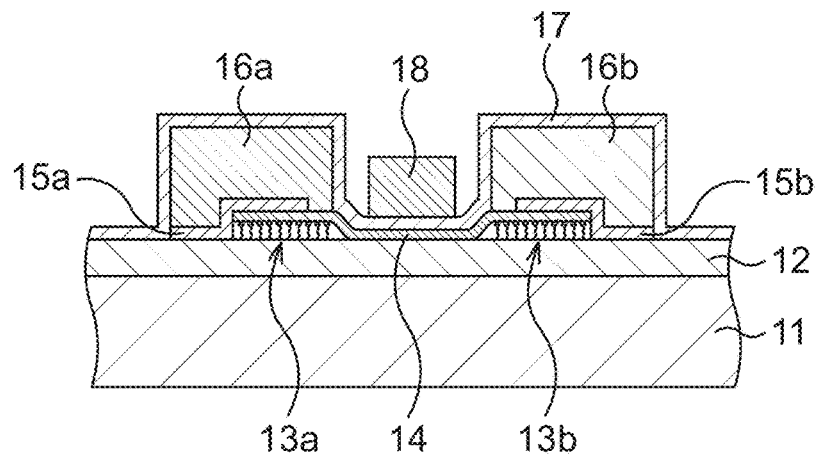
FIG. 3C is a schematic cross-sectional view illustrating, subsequently to FIG. 3B, the method for manufacturing the graphene transistor according to the second embodiment in the process order.

Subsequently, as illustrated in FIG. 3C, a gate electrode 18 is formed.

In more detail, a resist is applied to the entire surface including the top of the gate insulating film 17, and the resist is processed by the photolithography to form an opening that exposes an electrode forming region. The electrode material, for example, Ti/Au is deposited by the vacuum deposition method or the like on the entire surface including the inside of the opening. By the lift-off method, the resist and Ti/Au thereon are removed. Thus, the gate electrode 18 is formed on the graphene film 14 via the gate insulating film 17.

Thereafter, through various processes such as formation of wiring connected to the source electrode 16a, the drain electrode 16b, and the gate electrode 18, formation of a protective film and so on, a graphene transistor is formed.

In the graphene transistor according to this embodiment, the molecular materials 13a, 13b are inserted between the silicon oxide film 12 and the graphene film 14. The molecular materials 13a, 13b are disposed to be aligned with the regions connected to the source electrode 16a and the drain electrode 16b of the graphene film 14. With this configuration, the graphene film 14 is supplied with charges from the dopant molecules of the molecular materials 13a, 13b and increases in density of states. This greatly decreases a contact resistance between the graphene film 14, and, the source electrode 16a and the drain electrode 16b.

As described above, this embodiment realizes a highly-reliable graphene transistor that realizes, even though using the graphene film 14 having high mobility for the channel material, a sufficiently low contact resistance between the graphene film 14, and, the source electrode 16a and the drain electrode 16b.

Third Embodiment

This embodiment discloses a transistor (CNT transistor) using a carbon nanotube (CNT) for the channel material, to which the connecting structure according to the first embodiment is applied. In this embodiment, the configuration of the CNT transistor will be described together with a method for manufacturing the same.

FIG. 5A to FIG. 6B are schematic cross-sectional views illustrating main processes of a method for manufacturing a CNT transistor according to a third embodiment. FIG. 7A to FIG. 7C are schematic plan views illustrating predetermined processes in the method for manufacturing the CNT transistor according to the third embodiment.

First, the processes in FIG. 2A, FIG. 2B are performed in sequence as in the second embodiment.

Figure 5A:
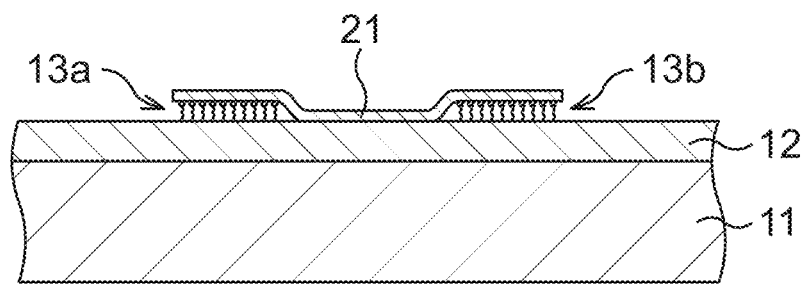
FIG. 5A is a schematic cross-sectional view illustrating a main process of a method for manufacturing a CNT transistor according to a third embodiment.

Subsequently, as illustrated in FIG. 5A and FIG. 7A, a CNT film 21 is formed by transfer on molecular materials 13a, 13b.

In more detail, a base made of, for example, quartz is placed in a CVD device, and a source gas, for example, a mixed gas of acetylene ($C_2H_2$) and Ar is introduced into the CVD device to grow a plurality of CNTs on the surface of the quartz base. On the quartz base, the CNTs are formed to be aligned in substantially parallel (Non-Patent Document 2). In a manner to cover the formed CNTs, polymethyl methacrylate (PMMA) is formed on the surface of the quartz base, and the quartz base is dissolved using, for example, a hydrofluoric acid. Thus, PMMA including the plurality of CNTs on the surface remains.

Then, the CNTs on PMMA are transferred onto the molecular materials 13a, 13b. The transferred CNTs are appropriately patterned by the lithography and etching. The etching is performed using oxygen plasma. Thus, the CNT film 21 constituting a channel region is formed on the molecular materials 13a, 13b. A CNT group in which a plurality of CNTs 21a are aligned in substantially parallel is the CNT film 21.

Figure 5B:
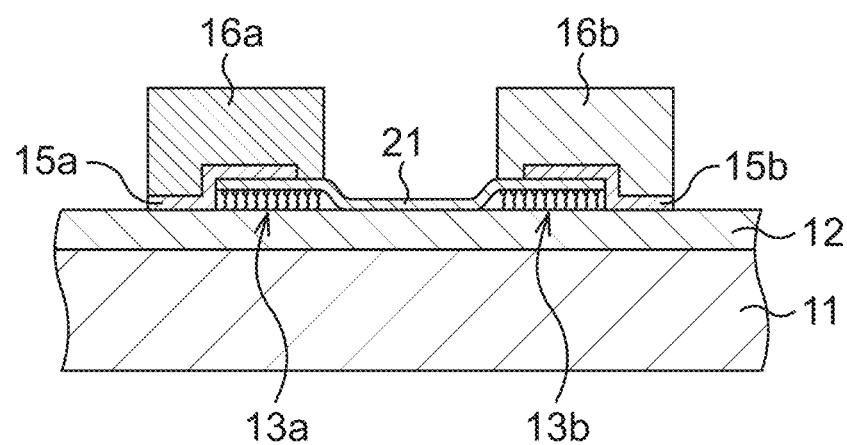
FIG. 5B is a schematic cross-sectional view illustrating, subsequently to FIG. 5A, a main process of the method for manufacturing the CNT transistor according to the third embodiment.

Subsequently, as illustrated in FIG. 5B, a source electrode 16a and a drain electrode 16b are formed on the CNT film 21 via adhesive films 15a, 15b.

First, as illustrated in FIG. 5B and FIG. 7B, the conductive adhesive films 15a, 15b are formed on the CNT film 21 and an electrode material is formed thereon.

In more detail, a resist is applied to the entire surface including the top of the CNT film 21, and the resist is processed by the photolithography to form predetermined openings. An adhesive material and an electrode material are sequentially deposited on the entire surface including the inside of the openings. As the adhesive material, a metal material of one kind of Ti, Cr, and Ni, here, Ti is deposited into a thickness of about 1 nm. As the electrode material, a metal material of one kind of Au, Ag, Al, Pt, Cu, Ir, and Pd, here, Au is deposited into a thickness of about 5 nm. By the lift-off method, the resist and Ti and Au thereon are removed. Thus, the conductive adhesive films 15a, 15b are formed on the CNT film 21, and Au is formed thereon. Note that in FIG. 7B, the illustration of Au on the conductive adhesive films 15a, 15b is omitted in consideration of viewability of the drawing.

The adhesive films 15a, 15b (and Au thereon) are formed into electrode shapes covering the electrode forming regions on the CNT film 21 including the regions corresponding to the top of the molecular materials 13a, 13b, and formed to be smaller in area than electrodes which will be formed afterward. Specifically, in the adhesive films 15a, 15b, recessed parts 15A, 15B are formed to leave channel edge parts at portions facing to each other on the CNT film 21. Where the overall width of the CNT film 21 is $W_0$ and the width of the portion of the CNT film 21 corresponding to the channel edge part is $W_1$, the recessed parts 15A, 15B are formed so that a ratio R of the width $W_1$ in the width $W_0$ satisfies $$R = 2W_1/W_0 \times 100 \leq 10\%.$$

A recess depth D of the recessed parts 15A, 15B is adjusted to be about 10 nm or more and about 5 μm or less. The adhesive material such as Ti, Cr, Ni or the like may modulate the electronic state of the CNT to deteriorate the contact resistance. In this embodiment, the adhesive material is removed near the channel edge parts into which charges are injected from the electrodes to form the recessed parts 15A, 15B. Thus, regions where the electrodes are in direct contact with the CNT film 21 at the recessed parts 15A, 15B are provided when the electrodes are formed, thereby suppressing as much as possible the modulation of the electronic state in the CNT film 21. When the above ratio R is 10% or less, the modulation of the electronic state is reduced to a degree of causing little or no problem.

Next, as illustrated in FIGS. 5B and 7C, a source electrode 16a and a drain electrode 16b are formed on the adhesive films 15a, 15b and on Au thereon.

In more detail, a resist is applied to the entire surface including the top of the adhesive films 15a, 15b and Au thereon, and the resist is processed by the photolithography to form openings that expose the electrode forming regions. The electrode material, here, Au is deposited by the vacuum deposition method or the like on the entire surface including the inside of the openings into a thickness of, for example, about 50 nm. By the lift-off method, the resist and Au thereon are removed. Thus, the source electrode 16a and the drain electrode 16b covering the adhesive films 15a, 15b are formed. Below regions of the source electrode 16a and the drain electrode 16b, which are electrically connected to the CNT film 21, the molecular materials 13a, 13b are located. The source electrode 16a and the drain electrode 16b are in direct contact with the CNT film 21 at the recessed parts 15A, 15B of the adhesive films 15a, 15b. This configuration suppresses as much as possible the modulation of the electronic state in the CNT film 21.

Figure 6A:
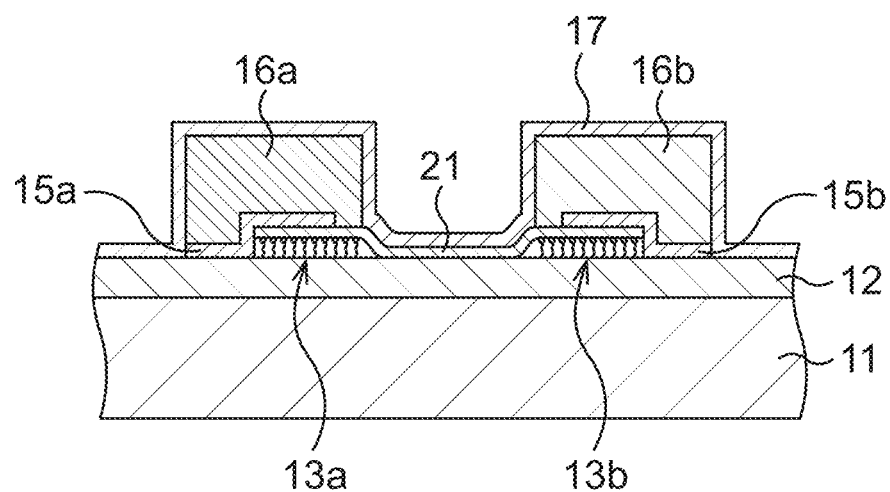
FIG. 6A is a schematic cross-sectional view illustrating, subsequently to FIG. 5B, a main process of the method for manufacturing the CNT transistor according to the third embodiment.
Figure 7A:
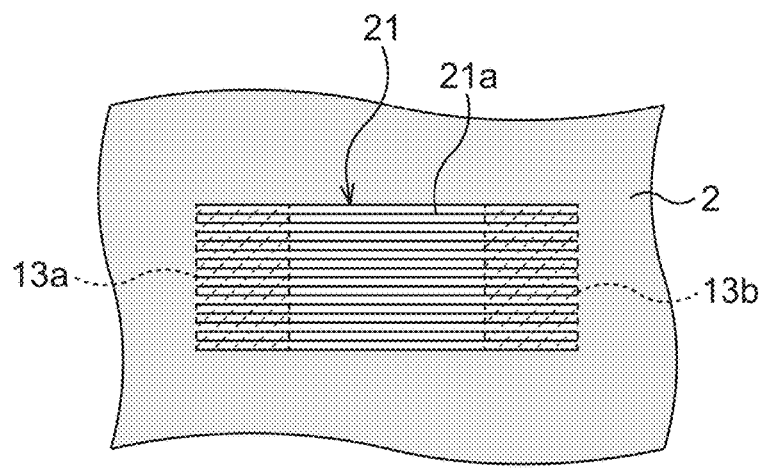
FIG. 7A is a schematic plan view illustrating a predetermined process in the method for manufacturing the CNT transistor according to the third embodiment.
Figure 7B:
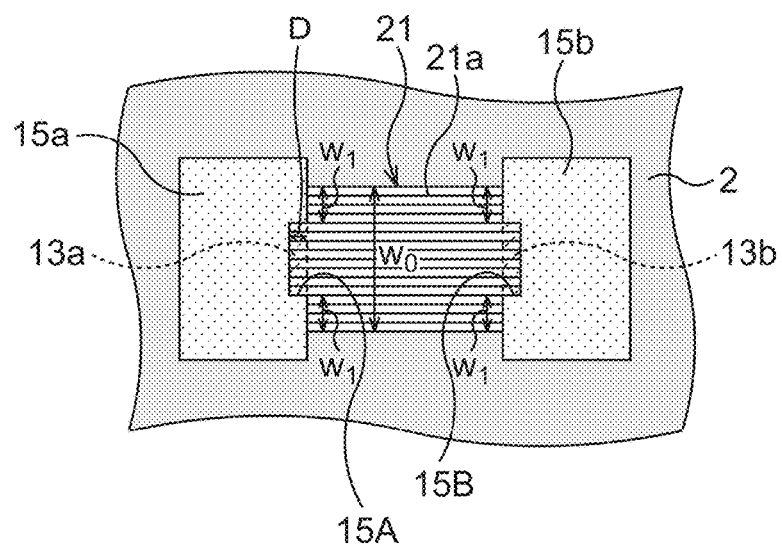
FIG. 7B is a schematic plan view illustrating a predetermined process in the method for manufacturing the CNT transistor according to the third embodiment.
Figure 7C:
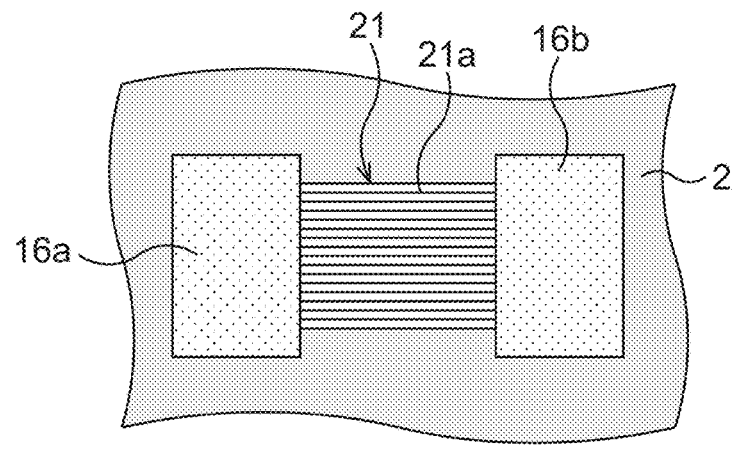
FIG. 7C is a schematic plan view illustrating a predetermined process in the method for manufacturing the CNT transistor according to the third embodiment.

Subsequently, as illustrated in FIG. 6A, a gate insulating film 17 is formed.

In more detail, first, on the entire surface including the CNT film 21 between the source electrode 16a and the drain electrode 16b, Al is deposited by the vacuum deposition method or the like into a thickness of, for example, about 1 nm, and the Al is subjected to natural oxidation.

Then, for example, $HfO_2$ is deposited as an insulating material on Al. $HfO_2$ is deposited, for example, by ALD method into a thickness of, for example, about 5 nm. Thus, the gate insulating film 17 is formed.

Note that the deposition of $HfO_2$ may be performed, for example, by the CVD method, the sputtering method or the like in place of the ALD method. Further, instead of depositing $HfO_2$, a nitride or an oxynitride of Hf may be used. Besides, an oxide, a nitride, or an oxynitride of Si, Al, Zr, Ti, Ta, W may be used or they may be appropriately selected and deposited into multiple layers to form the gate insulating film.

Figure 6B:
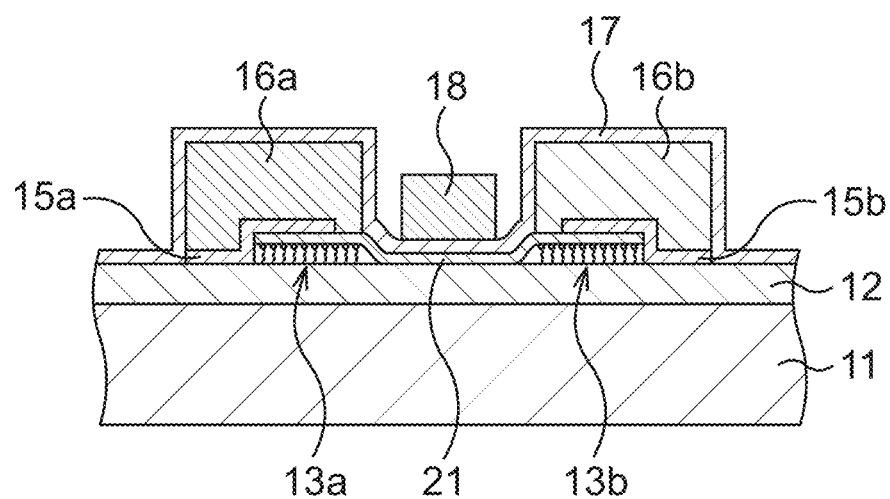
FIG. 6B is a schematic cross-sectional view illustrating, subsequently to FIG. 6A, a main process of the method for manufacturing the CNT transistor according to the third embodiment.

Subsequently, as illustrated in FIG. 6B, a gate electrode 18 is formed.

In more detail, a resist is applied to the entire surface including the top of the gate insulating film 17, and the resist is processed by the photolithography to form an opening that exposes an electrode forming region. The electrode material, for example, Ti/Au is deposited by the vacuum deposition method or the like on the entire surface including the inside of the opening. By the lift-off method, the resist and Ti/Au thereon are removed. Thus, the gate electrode 18 is formed on the CNT film 21 via the gate insulating film 17.

Thereafter, through various processes such as formation of wiring connected to the source electrode 16a, the drain electrode 16b, and the gate electrode 18, formation of a protective film and so on, a graphene transistor is formed.

In the graphene transistor according to this embodiment, the molecular materials 13a, 13b are inserted between the silicon oxide film 12 and the CNT film 21. The molecular materials 13a, 13b are disposed to be aligned with the regions connected to the source electrode 16a and the drain electrode 16b of the CNT film 21. With this configuration, the CNT film 21 is supplied with charges from the dopant molecules of the molecular materials 13a, 13b and increases in density of states. This greatly decreases a contact resistance between the CNT film 21, and, the source electrode 16a and the drain electrode 16b.

As described above, this embodiment realizes a highly-reliable CNT transistor that realizes, even though using the CNT film 21 having high mobility for the channel material, a sufficiently low contact resistance between the CNT film 21, and, the source electrode 16a and the drain electrode 16b.

Modified Example

This example discloses a CNT transistor as in the third embodiment, which is different from the third embodiment in that the configuration of the CNT film is different. In this embodiment, the configuration of the CNT transistor will be described together with a method for manufacturing the same.

FIG. 8A to FIG. 9B are schematic cross-sectional views illustrating main processes of a method for manufacturing a CNT transistor according to the modified example of the third embodiment. FIG. 10A to FIG. 10C are schematic plan views illustrating predetermined processes in the method for manufacturing the CNT transistor according to the modified example of the third embodiment.

First, the processes in FIG. 2A, FIG. 2B are performed in sequence as in the second embodiment.

Figure 8A:
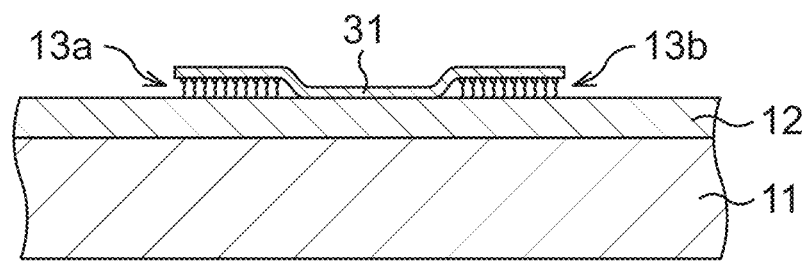
FIG. 8A is a schematic cross-sectional view illustrating a main process of the method for manufacturing a CNT transistor according to a modified example of the third embodiment.

Subsequently, as illustrated in FIG. 8A and FIG. 10A, a CNT film 31 is formed by transfer on molecular materials 13a, 13b.

In more detail, CNTs are dispersed, for example, in isopropyl alcohol (IPA), and the resultant is applied by the spin coat method onto the entire surface of the silicon oxide film 12 including the top of the molecular materials 13a, 13b. The CNTs are patterned by the lithography and etching. The etching is performed using oxygen plasma. Thus, a CNT film 31 constituting a channel region is formed on the molecular materials 13a, 13b. A CNT group composed of a plurality of CNTs 31a formed in random directions is the CNT film 31. This configuration forms a space between the molecular materials 13a and 13b under the CNT film 31.

Figure 8B:
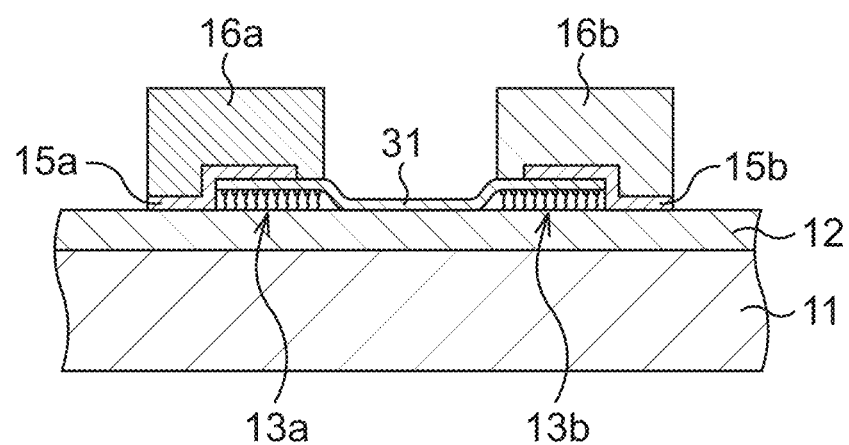
FIG. 8B is a schematic cross-sectional view illustrating, subsequently to FIG. 8A, a main process of the method for manufacturing the CNT transistor according to the modified example of the third embodiment.

Subsequently, as illustrated in FIG. 8B, a source electrode 16a and a drain electrode 16b are formed on the CNT film 31 via the adhesive films 15a, 15b.

First, as illustrated in FIG. 8B and FIG. 10B, the adhesive films 15a, 15b are formed on the CNT film 31 and an electrode material is formed thereon.

In more detail, a resist is applied to the entire surface including the top of the CNT film 31, and the resist is processed by the photolithography to form predetermined openings. An adhesive material and an electrode material are sequentially deposited on the entire surface including the inside of the openings. As the adhesive material, a metal material of one kind of Ti, Cr, and Ni, here, Ti is deposited into a thickness of about 1 nm. As the electrode material, a metal material of one kind of Au, Ag, Al, Pt, Cu, Ir, and Pd, here, Au is deposited into a thickness of about 5 nm. By the lift-off method, the resist and Ti and Au thereon are removed. Thus, the conductive adhesive films 15a, 15b are formed on the CNT film 31, and Au is formed thereon. Note that in FIG. 10B, the illustration of Au on the conductive adhesive films 15a, 15b is omitted in consideration of viewability of the drawing.

The adhesive films 15*a*, 15*b* (and Au thereon) are formed into electrode shapes covering the electrode forming regions on the CNT film 31 including the regions corresponding to the top of the molecular materials 13*a*, 13*b*, and formed to be smaller in area than electrodes which will be formed afterward. Specifically, in the adhesive films 15*a*, 15*b*, recessed parts 15A, 15B are formed to leave channel edge parts at portions facing to each other on the CNT film 31. Where the overall width of the CNT film 31 is $W_0$ and the width of the portion of the CNT film 31 corresponding to the channel edge part is $W_1$, the recessed parts 15A, 15B are formed so that a ratio R of the width $W_1$ in the width $W_0$ satisfies $$R=2W_1/W_0 \times 100 \leq 10\%.$$

A recess depth D of the recessed parts 15A, 15B is adjusted to be about 10 nm or more and about 5 μm or less. The adhesive material such as Ti, Cr, Ni or the like may modulate the electronic state of the CNT to deteriorate the contact resistance. In this embodiment, the adhesive material is removed near the channel edge parts into which charges are injected from the electrodes to form the recessed parts 15A, 15B. Thus, regions where the electrodes are in direct contact with the CNT film 31 at the recessed parts 15A, 15B are provided when the electrodes are formed, thereby suppressing as much as possible the modulation of the electronic state in the CNT film 31. When the above ratio R is 10% or less, the modulation of the electronic state is reduced to a degree of causing little or no problem.

Next, as illustrated in FIGS. 8B and 10C, a source electrode 16*a* and a drain electrode 16*b* are formed on the adhesive films 15*a*, 15*b* and on Au thereon.

In more detail, a resist is applied to the entire surface including the top of the adhesive films 15*a*, 15*b* and Au thereon, and the resist is processed by the photolithography to form openings that expose the electrode forming regions. The electrode material, here, Au is deposited by the vacuum deposition method or the like on the entire surface including the inside of the openings into a thickness of, for example, about 50 nm. By the lift-off method, the resist and Au thereon are removed. Thus, the source electrode 16*a* and the drain electrode 16*b* covering the adhesive films 15*a*, 15*b* are formed. Below regions of the source electrode 16*a* and the drain electrode 16*b*, which are electrically connected to the CNT film 31, the molecular materials 13*a*, 13*b* are located. The source electrode 16*a* and the drain electrode 16*b* are in direct contact with the CNT film 31 at the recessed parts 15A, 15B of the adhesive films 15*a*, 15*b*. This configuration suppresses as much as possible the modulation of the electronic state in the CNT film 31.

Figure 9A:
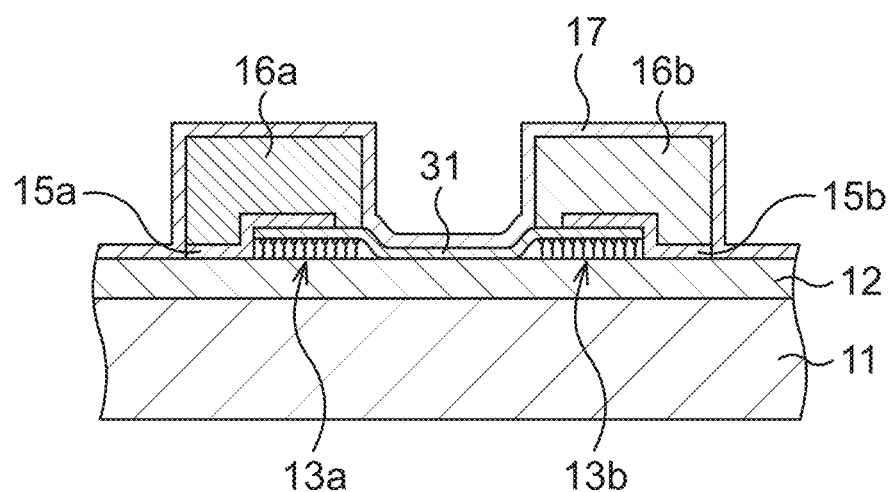
FIG. 9A is a schematic cross-sectional view illustrating, subsequently to FIG. 8B, a main process of the method for manufacturing the CNT transistor according to the modified example of the third embodiment.
Figure 10A:
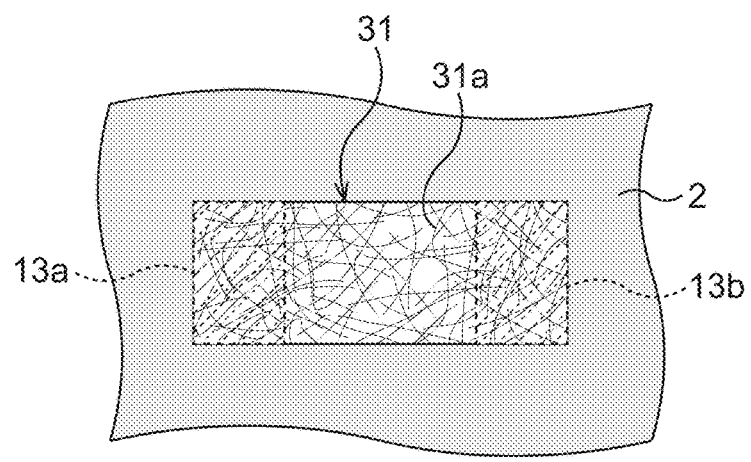
FIG. 10A is a schematic plan view illustrating a predetermined process in the method for manufacturing the CNT transistor according to the modified example of the third embodiment.
Figure 10B:
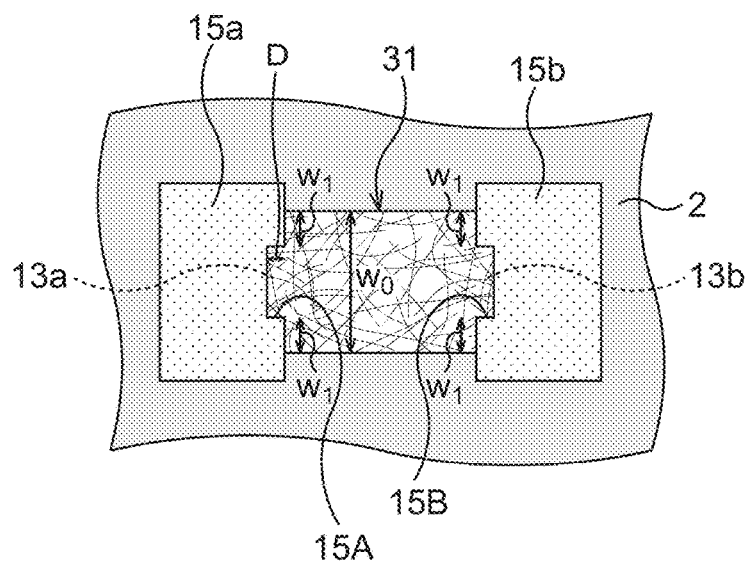
FIG. 10B is a schematic plan view illustrating a predetermined process in the method for manufacturing the CNT transistor according to the modified example of the third embodiment.
Figure 10C:
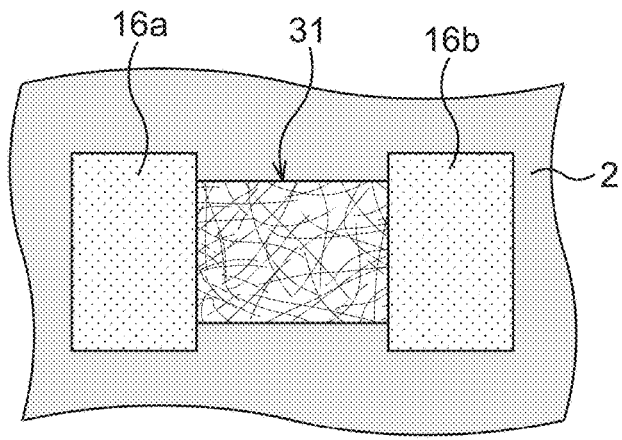
FIG. 10C is a schematic plan view illustrating a predetermined process in the method for manufacturing the CNT transistor according to the modified example of the third embodiment.

Subsequently, as illustrated in FIG. 9A, a gate insulating film 17 is formed.

In more detail, first, on the entire surface including the CNT film 31 between the source electrode 16*a* and the drain electrode 16*b*, Al is deposited by the vacuum deposition method or the like into a thickness of, for example, about 1 nm, and the Al is subjected to natural oxidation.

Then, for example, $HfO_2$ is deposited as an insulating material on Al. $HfO_2$ is deposited, for example, by the ALD method into a thickness of, for example, about 5 nm. Thus, the gate insulating film 17 is formed.

Note that the deposition of $HfO_2$ may be performed, for example, by the CVD method, the sputtering method or the like in place of the ALD method. Further, instead of depositing $HfO_2$, a nitride or an oxynitride of Hf may be used. Besides, an oxide, a nitride, or an oxynitride of Si, Al, Zr, Ti, Ta, W may be used or they may be appropriately selected and deposited into multiple layers to form the gate insulating film.

Figure 9B:
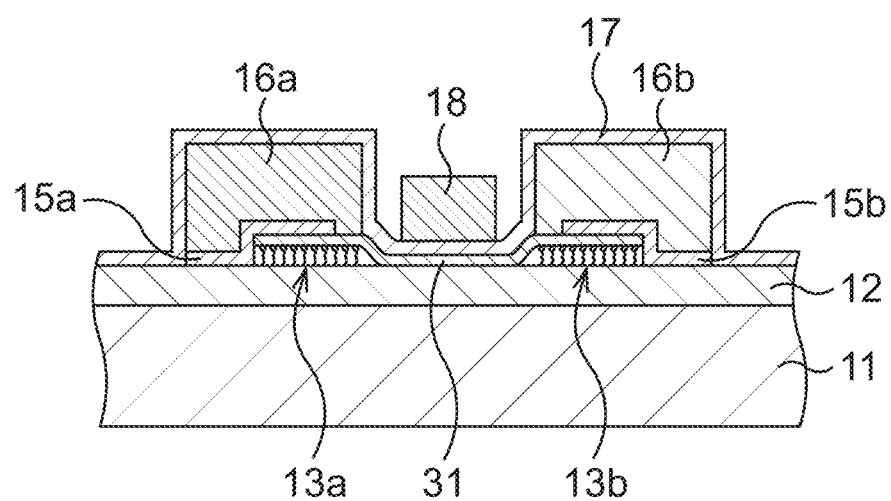
FIG. 9B is a schematic cross-sectional view illustrating a main process of the method for manufacturing, subsequently to FIG. 9A, the CNT transistor according to the modified example of the third embodiment.

Subsequently, as illustrated in FIG. 9B, a gate electrode 18 is formed.

In more detail, a resist is applied to the entire surface including the top of the gate insulating film 17, and the resist is processed by the photolithography to form an opening that exposes an electrode forming region. The electrode material, for example, Ti/Au is deposited by the vacuum deposition method or the like on the entire surface including the inside of the opening. By the lift-off method, the resist and Ti/Au thereon are removed. Thus, the gate electrode 18 is formed on the CNT film 31 via the gate insulating film 17.

Thereafter, through various processes such as formation of wiring connected to the source electrode 16*a*, the drain electrode 16*b*, and the gate electrode 18, formation of a protective film and so on, a graphene transistor is formed.

In the graphene transistor according to this embodiment, the molecular materials 13*a*, 13*b* are inserted between the silicon oxide film 12 and the CNT film 31. The molecular materials 13*a*, 13*b* are disposed to be aligned with the regions connected to the source electrode 16*a* and the drain electrode 16*b* of the CNT film 31. With this configuration, the CNT film 31 is supplied with charges from the dopant molecules of the molecular materials 13*a*, 13*b* and increases in density of states. This greatly decreases a contact resistance between the CNT film 31, and, the source electrode 16*a* and the drain electrode 16*b*.

As described above, this embodiment realizes a highly-reliable CNT transistor that realizes, even though using the CNT film 31 having high mobility for the channel material, a sufficiently low contact resistance between the CNT film 31, and, the source electrode 16*a* and the drain electrode 16*b*.

According to the present invention, it is possible to obtain a highly-reliable connecting structure that realizes, even though using a nanocarbon material, a sufficiently low contact resistance between the nanocarbon material and an electrode.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A connecting structure comprising:
   a substrate;
   a silicon oxide film provided on the substrate;
   graphene formed above the silicon oxide film; and
   an electrode electrically connected to the graphene,
   wherein a molecular material having a doping function and contacting respectively with the silicon oxide film and the graphene is inserted between the silicon oxide film and the graphene, and
   wherein the molecular material is composed of a SAM film of one kind of 3-aminopropyltrimethoxy(ethoxy)silane, N-methyl-3-aminopropylmethoxysilane, and N-dimethyl-3-aminopropylmethoxysilane.

2. The connecting structure according to claim 1, wherein the molecular material is disposed to be aligned with a region connected to the electrode of the graphene.

3. The connecting structure according to claim 1, further comprising:
a conductive adhesive film formed between the graphene and the electrode.

4. The connecting structure according to claim 3, wherein the adhesive film is formed under the electrode and to be smaller in area than the electrode.

5. The connecting structure according to claim 1, wherein the electrode is formed of a material that does not modulate an electronic state of the graphene.

6. A semiconductor device comprising the connecting structure according to claim 1,
wherein the electrode is a source electrode and a drain electrode, and
wherein a gate electrode formed between the source electrode and the drain electrode is provided.

7. The connecting structure according to claim 1, wherein the molecular material is composed of a SAM film of N-dimethyl-3-aminopropylmethoxysilane.

8. The connecting structure according to claim 1, wherein the molecular material is surrounded by a bottom surface of the electrode.

9. A method for manufacturing a connecting structure comprising:
forming a molecular material having a doping function on a silicon oxide film provided on a substrate;
forming graphene on the molecular material; and
forming an electrode electrically connected to the graphene,
wherein the molecular material is composed of a SAM film of one kind of 3-aminopropyltrimethoxy(ethoxy)silane, N-methyl-3-aminopropylmethoxysilane, and N-dimethyl-3-aminopropylmethoxysilane and contacts respectively with the silicon oxide film and the graphene.

10. The method for manufacturing a connecting structure according to claim 9,
wherein the molecular material is disposed to be aligned with a region connected to the electrode of the graphene.

11. The method for manufacturing a connecting structure according to claim 9, further comprising:
forming a conductive adhesive film between the graphene and the electrode.

12. The method for manufacturing a connecting structure according to claim 11,
wherein the adhesive film is formed under the electrode and to be smaller in area than the electrode.

13. The method for manufacturing a connecting structure according to claim 9,
wherein the electrode is formed of a material that does not modulate an electronic state of the graphene.

14. The connecting structure according to claim 9, wherein the molecular material is composed of a SAM film of N-dimethyl-3-aminopropylmethoxysilane.

15. The connecting structure according to claim 9, wherein the molecular material is surrounded by a bottom surface of the electrode.

* * * * *